(12) United States Patent
Hashimoto

(10) Patent No.: US 7,769,065 B2
(45) Date of Patent: Aug. 3, 2010

(54) SEMICONDUCTOR OPTICAL DEVICE

(75) Inventor: Jun-ichi Hashimoto, Yokohama (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 11/717,146

(22) Filed: Mar. 13, 2007

(65) Prior Publication Data

US 2007/0217465 A1  Sep. 20, 2007

(30) Foreign Application Priority Data

Mar. 20, 2006  (JP)  .......................... P2006-077541

(51) Int. Cl.
*H01S 3/04* (2006.01)
(52) U.S. Cl. .................................. 372/43.01
(58) Field of Classification Search ............... 372/43.01
See application file for complete search history.

(56) References Cited

U.S. PATENT DOCUMENTS

| 4,302,729 | A | * | 11/1981 | Burnham et al. | ....... | 372/46.012 |
| 6,046,096 | A | * | 4/2000 | Ouchi | ....................... | 438/510 |
| 6,075,801 | A | * | 6/2000 | Tamanuki et al. | ........ | 372/46.01 |
| 7,125,736 | B2 | * | 10/2006 | Morita | ......................... | 438/44 |
| 2004/0208213 | A1 | * | 10/2004 | Lichtenstein et al. | .......... | 372/43 |

FOREIGN PATENT DOCUMENTS

| JP | 62-92388 | 4/1987 |
| JP | 63-153884 | 6/1988 |
| JP | 3-62985 | 3/1991 |
| JP | 5-198896 | 8/1993 |
| JP | 5-343791 | 12/1993 |
| JP | 8-88443 | 4/1996 |
| JP | 10-152399 | 6/1998 |
| JP | 11-74607 | 3/1999 |
| JP | 2000-353859 | 12/2000 |
| JP | 2001-223426 | 8/2001 |
| JP | 2003-202529 | 7/2003 |
| JP | 2005-243722 | 9/2005 |
| JP | 2005-276928 | 10/2005 |

OTHER PUBLICATIONS

Japanese Office Action issued Feb. 2, 2010 for priority Japanese Application No. 2006-077541 w/English language translation.

* cited by examiner

*Primary Examiner*—Minsun Harvey
*Assistant Examiner*—Patrick Stafford
(74) *Attorney, Agent, or Firm*—Smith, Gambrell & Russell, LLP

(57) ABSTRACT

A semiconductor optical device includes a GaAs substrate having a surface with periodic projections and recesses for a diffraction grating; a III-V compound semiconductor layer provided on the surface of the GaAs substrate; and an active layer which is made of III-V compound semiconductor containing nitrogen and arsenic as constituent elements, the active layer being provided on the III-V compound semiconductor layer.

9 Claims, 9 Drawing Sheets

SEMICONDUCTOR OPTICAL DEVICE

BACKGROUND OF THE INVENTION

1. Field of the Invention

The present invention relates to a semiconductor optical device.

2. Related Background Art

Semiconductor lasers are known in which an active layer made of GaInNAs is provided on a GaAs substrate, and a diffraction grating is formed in which convex sections and concave sections are periodically arranged on this active layer (see Laid-open Japanese Patent Application No. H11-74607 and Laid-open Japanese Patent Application No. 2003-202529).

SUMMARY OF THE INVENTION

In order to obtain a diffraction grating as described above, a fine resist patterning with a period of a few hundred nm using photolithography, and a fine grating-layer etching with the etching depth of a few tens of nm are required. However, the exposure conditions and etching conditions when forming the diffraction gratings are easily affected by external factors such as for example temperature, humidity, vibration and a current of air. For this reason, it is difficult to form a diffraction grating with high quality and high reproducibility.

Also, when a diffraction grating is formed on an active layer, unless several semiconductor layers including the diffraction grating layer are grown on the GaAs substrate, it is difficult to ascertain the quality of the diffraction grating layer. Therefore, it takes much time to judge whether the grating quality is good or bad. In the case of the quality of the diffraction grating being bad, the GaAs substrate that was being processed had to be discarded and the process recommenced from the beginning using a fresh unused GaAs substrate. Consequently, the productivity of quality products was low, causing increased production costs.

Accordingly, the present inventors investigated the possibility of forming a diffraction grating between the GaAs substrate and the active layer. Specifically, a diffraction grating was formed on the surface of the GaAs substrate and an active layer was then grown on the grating. With this structure, there is no need to separately provide a thick lower cladding layer, since the GaAs substrate performs the function of the lower cladding layer. Consequently, the structure of a semiconductor optical device can be simplified and the cost of manufacturing the semiconductor optical device can be reduced, since the number of steps involved in the process is reduced. Also, the quality of the diffraction grating can be ascertained at an early stage, since the diffraction grating is formed prior to the growth of the semiconductor layers that are necessary for formation of the light-emitting device such as the active layer. Consequently, productivity of quality products can be improved.

In addition, the present inventors discovered that if the diffraction grating is formed on the GaAs substrate surface, crystal defects present on the surface of the diffraction grating may affect the active layer, deteriorating the reliability or internal quantum efficiency of the optical device. Crystal defects present on the surface of the diffraction grating tend to be formed when the diffraction grating is formed by etching the surface of the GaAs substrate.

The present invention was made in view of the above circumstances, its object being to provide a semiconductor optical device of high light emission efficiency.

In order to solve the problems described above, a semiconductor optical device according to the present invention comprises: a GaAs substrate having a surface with periodic projections and recesses for a diffraction grating; a III-V compound semiconductor layer provided on the surface of the GaAs substrate; and an active layer which is made of III-V compound semiconductor including nitrogen and arsenic as structural elements, and is provided on the first-mentioned III-V compound semiconductor layer.

DESCRIPTION OF THE PREFERRED EMBODIMENTS

Embodiments of the present invention are described in detail below with reference to the appended drawings. In the description of the drawings, identical or similar elements are given the same reference symbols, to avoid duplication of description.

First Embodiment

Figure 1:
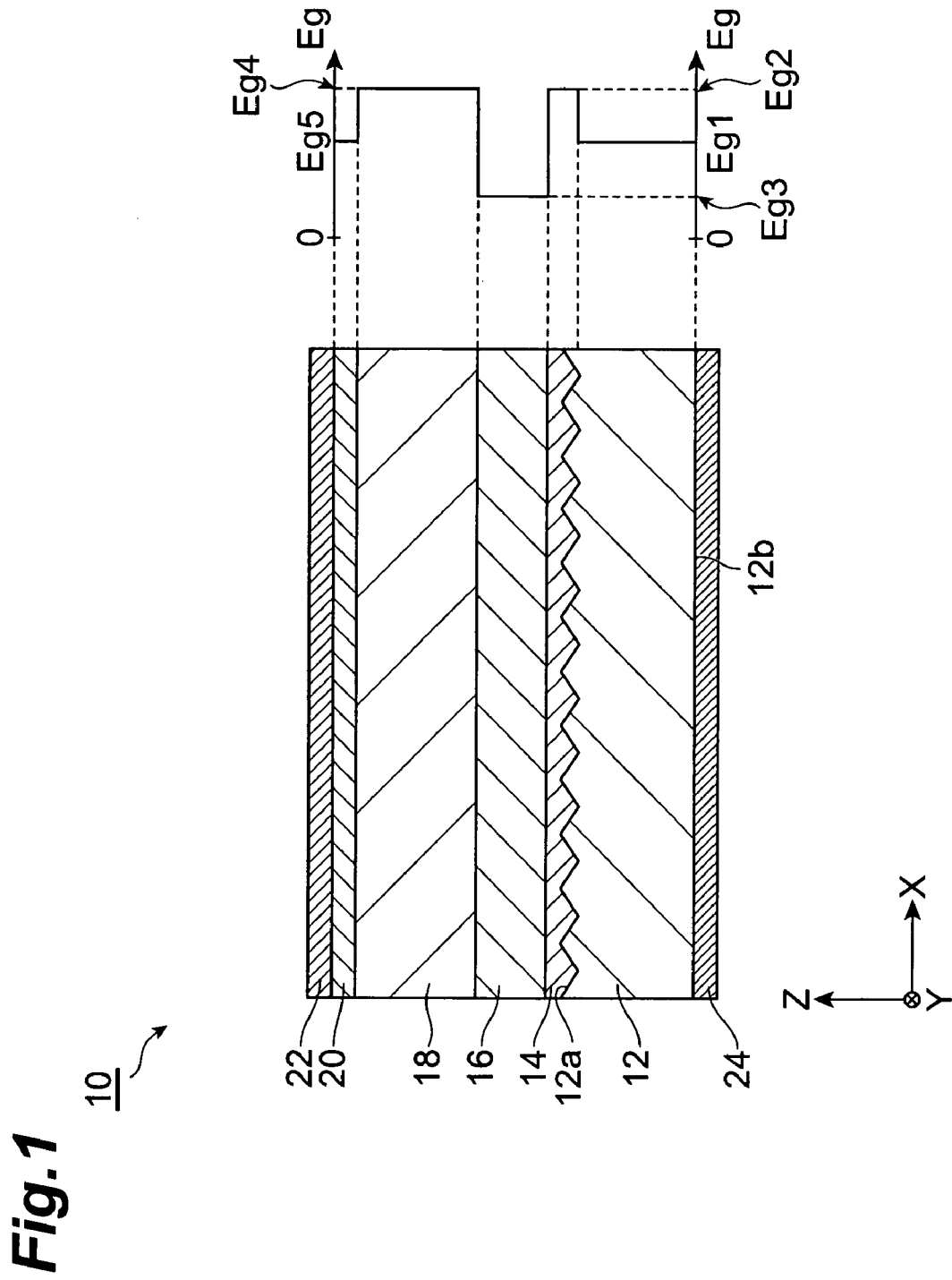
FIG. 1 is a cross-sectional view showing schematically a semiconductor optical device according to a first embodiment.

FIG. 1 is a cross-sectional view showing schematically a semiconductor optical device according to a first embodiment. In FIG. 1, an X axis, Y axis and Z axis are shown, indicating a three-dimensional space. Also, in FIG. 1, an energy band diagram of a semiconductor optical device according to the first embodiment is included in the Figure. The axis Eg shows the magnitude of the band gap energy.

The semiconductor optical device 10 shown in FIG. 1 comprises a GaAs substrate 12 of first conductivity type (in this case assumed to be n type), a III-V compound semiconductor layer 14 provided on the surface 12a of the GaAs substrate 12, an active layer 16 provided on the III-V compound semiconductor layer 14, and an upper cladding layer 18 of second conductivity type (in this case assumed to be p type) provided on the active layer 16. Periodic projections and recesses for a diffraction grating are formed on the surface 12a of the GaAs substrate 12. The diffraction grating is obtained by forming periodically grooves extending for example in the Y axis direction on the surface 12a with a prescribed pitch in the X axis direction. The pitch of the grooves is for example a few hundred nm, and their depth is for example a few tens of nm. The thickness direction of the GaAs substrate 12 is the Z axis direction.

A contact layer 20 and electrode 22 are provided in this order on the upper cladding layer 18. Ohmic contact of the electrode 22 is realized by means of the contact layer 20. An electrode 24 is provided on the face (back face) 12b of the GaAs substrate 12 on the opposite side to the surface 12a. The semiconductor optical device 10 is for example a distributed feedback (DFB) semiconductor laser of oscillation wavelength of longer than 1 µm employed in optical communication.

The diffraction grating is obtained by forming grooves on the surface of the GaAs substrate by for example dry etching. Preferably the GaAs substrate prior to dry etching comprises a bulk substrate obtained by for example slicing of a GaAs ingot, and a GaAs buffer layer grown on the bulk substrate. On the surface 12a of the GaAs substrate 12, usually, crystal defects are present caused by for example damage due to cracking or scratches formed during manufacture of the GaAs substrate; the density of the crystal defects is usually 100 to 2000 (cm$^{-2}$). In addition, new defects are easily added by processing damage when a diffraction grating is formed on the surface 12a. The band gap energy (Eg1) of the GaAs substrate 12 is about 1.42 eV (1 eV=1.6×10$^{-19}$ J).

As shown in the energy band diagram in FIG. 1, the band gap energy (Eg2) of the III-V compound semiconductor layer 14 is preferably larger than the band gap energy (Eg1) of the GaAs substrate 12. The band gap energy (Eg3) of the active layer 16 is smaller than the band gap energy (Eg1) of the GaAs substrate 12. The band gap energy (Eg4) of the upper cladding layer 18 is larger than the band gap energy (Eg3) of the active layer 16. The band gap energy (Eg5) of the contact layer 20 is smaller than the band gap energy (Eg4) of the upper cladding layer 18.

Preferably the III-V compound semiconductor layer 14 is made of a semiconductor material having a lattice constant that is the same as or close to the lattice constant of GaAs. If this is the case, defects caused by lattice mismatching are not produced, so a III-V compound semiconductor layer 14 of excellent crystal properties can be epitaxially grown on the surface 12a of the GaAs substrate 12.

Preferably the III-V compound semiconductor layer 14 is made of for example Al-free material such as GaInAs, GaAs, GaInP, GaInAsP or a III-V compound semiconductor material containing N, Ga and As, like the material of the active layer 16, to be described. If such a material is employed, oxidation of Al at the interfaces between the III-V compound semiconductor layer 14 and the active layer 16 cannot occur. Consequently, increase in the number of nonradiative recombination centers caused by oxidation of Al at such interfaces can be suppressed. Also, since no oxidation of Al occurs at the surface of the III-V compound semiconductor layer 14, an active layer 16 can be grown on the surface of the semiconductor layer 14 with good crystal quality. In this way, a semiconductor optical device 10 of excellent performance and reliability is obtained.

It should be noted that the III-V compound semiconductor layer 14 may comprise for example of III-V compound semiconductor containing Al, such as AlGaInP, or AlGaAs.

A band gap energy of up to about 2.3 eV can be realized by adjusting the composition ratios of AlGaInP lattice-matched to GaAs. A band gap energy of up to about 2.16 eV can be realized by adjusting the composition ratios of AlGaAs lattice-matched to GaAs. A band gap energy of up to about 1.9 eV can be realized by adjusting the composition ratios of GaInAsP lattice-matched to GaAs. A band gap energy of about 1.9 eV can be realized by adjusting the composition ratios of GaInP lattice-matched to GaAs.

In order to avoid the optical loss of the waveguiding light due to free carrier absorption, the III-V compound semiconductor layer 14 is preferably made of undoped III-V compound semiconductor, but it would also be possible to dope the III-V compound semiconductor layer 14 with impurities. If the III-V compound semiconductor layer 14 is doped with impurities, the III-V compound semiconductor layer 14 is preferably of the first conductivity type.

The thickness of the III-V compound semiconductor layer 14 is preferably not more than 0.2 µm (200 nm) and is even more preferably more than 5 nm but not more than 50 nm. It is preferable that the thickness of the III-V compound semiconductor layer 14 is more than the groove depth of the diffraction grating in order to bury the diffraction grating by the semiconductor layer 14 to produce a flat surface. In this case, flat growths of other semiconductor layers on the III-V compound semiconductor layer 14 can be also possible, and therefore, occurrence of abnormal growth caused by projections and recesses of the underlying grating is suppressed, making it possible to achieve excellent epitaxial growth. If the III-V compound semiconductor layer 14 has a small thickness of not more than 0.2 µm, the distance between the light propagating in the active layer 16 and the diffraction grating is sufficiently small, so that the optical coupling of the light onto the diffraction grating is enhanced, making it easy to achieve excellent light emission performance. Also, since the III-V compound semiconductor layer 14 has a small thickness of not more than 0.2 µm, the waveguiding light is not confined in this III-V compound semiconductor layer 14 but leaks considerably into the GaAs substrate 12. Consequently, the III-V compound semiconductor layer 14 does not function as a cladding layer. On the other hand, if the thickness of the III-V compound semiconductor layer 14 exceeds 0.2 µm, the III-V compound semiconductor layer 14 becomes a barrier, as a result of which carrier injection from the GaAs substrate 12 into the active layer 16 becomes difficult. In addition, the distance between the active layer 16 and the diffraction grating becomes large, so that the optical coupling efficiency of waveguiding light onto the diffraction grating is reduced. Therefore, the light emission efficiency is deteriorated. Also, if the thickness of the III-V compound semiconductor layer 14 is less than 5 nm, the effect of preventing crystal defects present on the surface 12a of the diffraction grating from propagating to the active layer 16 becomes insufficient, so the crystal quality of the active layer 16 tends to be lowered.

The active layer 16 may have any of bulk structure, single quantum well structure (SQW), or multiple quantum well structure (MQW). For example if the active layer 16 is of multiple quantum well structure, the active layer 16 may comprise of alternately stacked barrier layers and well layers.

The active layer 16 may be a III-V compound semiconductor containing as structural elements nitrogen and arsenic and, in addition, if necessary, gallium. Specific examples that may be mentioned are GaInNAs, and GaNAs. In one practical example, the active layer 16 comprises of GaAs barrier layers of thickness 8 nm and $Ga_{0.65}In_{0.35}N_{0.006}As_{0.994}$ well layers of thickness 7 nm that are alternately stacked.

The lattice constant of the III-V compound semiconductor material containing N, Ga and As can be set to a lattice constant that is the same as or close to the lattice constant of GaAs by adjusting the composition ratios. If this is done, the possibility of generating defects caused by lattice mismatching can be eliminated, making it possible to grow an active layer 16 of excellent crystal properties on the GaAs substrate 12. The band gap energy of the III-V compound semiconductor material containing N, Ga and As normally corresponds to a photoluminescence wavelength of more than 1 µm. If such a III-V compound semiconductor material containing N, Ga and As is employed for the active layer 16, an oscillation wavelength in the long wavelength region of more than 1 µm can easily be achieved. A light source for optical communication in for example from 1 to 1.6 µm wavelength region can thus easily be manufactured. It should be noted that GaAs is transparent with respect to emitted light of above wavelength region, so the light is not absorbed by the GaAs substrate 12. Also, GaAs is of lower refractive index than the III-V compound semiconductor material containing N, Ga and As. The GaAs substrate 12 can therefore also provide the function of a lower cladding layer, since it acts to confine the emitted light in the active layer 16 without absorbing the emitted light.

Also, at least one of Sb and P may be added to the GaInNAs or GaNAs. Sb functions as a so-called surfactant, suppressing three-dimensional growth of the GaInNAs or GaNAs. In this way, the crystal quality of the GaInNAs or GaNAs is improved. P reduces the local crystal distortion of the GaInNAs or GaNAs. In this way, the crystal quality of the GaInNAs or GaNAs is improved. Also, P increases the N content incorporated in the crystal when crystal growth is performed.

GaNAsP, GaInNAsP, GaNAsSb, GaInNAsSb, GaNAsSbP, and GaInNAsSbP may be mentioned as examples of III-V compound semiconductor materials containing N, Ga and As, and to which at least one of Sb and P has been added. The lattice constants of these group III-V nitride semiconductor materials can be set to a lattice constant that is the same as or close to the lattice constant of GaAs by adjusting their composition ratios. Consequently, no defects caused by lattice mismatching are produced, so these materials can be grown with excellent crystal properties on the GaAs substrate 12.

The upper cladding layer 18 is preferably made of III-V compound semiconductor of second conductivity type. Even more preferably, the upper cladding layer 18 is made of a semiconductor material lattice-matched to GaAs. Examples of materials that may be used for the upper cladding layer 18 include GaAs or, apart from this, AlGaInP, GaInP, AlGaAs, or GaInAsP, lattice-matched to GaAs.

The band gap energy (Eg4) of the upper cladding layer 18 is preferably larger than the band gap energy of GaAs. If this is the case, the band gap energy difference between the active layer 16 and the upper cladding layer 18 can be made larger than the case where GaAs is employed for the upper cladding layer 18. Carriers can thereby be more strongly confined in the active layer 16.

Also, since the band gap energy (Eg4) of the upper cladding layer 18 is larger than the band gap energy of GaAs, the refractive index of the upper cladding layer 18 is significantly lower than the refractive index of GaAs. Consequently, since the refractive index difference between the active layer 16 and the upper cladding layer 18 becomes larger, light can be more strongly confined in the active layer 16 than in the case where GaAs is employed for the upper cladding 18. For the above reasons, the light emission efficiency of the semiconductor optical device 10 becomes even higher than if GaAs were employed for the upper cladding layer 18.

In order to facilitate formation of ohmic contact with the electrode 22, preferably the contact layer 20 is made of III-V compound semiconductor of second conductivity type of small band gap energy. The contact layer 20 may be made of for example p+-GaAs.

When growing the III-V compound semiconductor layer 14, active layer 16, upper cladding layer 18 and contact layer 20, for example a crystal growth method such as the OMVPE method or MBE method may be employed.

With the semiconductor optical device 10 described above, thanks to the provision of the III-V compound semiconductor layer 14 between the GaAs substrate 12 and the active layer 16, crystal defects present on the diffraction grating surface 12a of the GaAs substrate 12 can be prevented from propagating and reaching the active layer 16. Consequently, lowering of crystal quality of the active layer 16 can be suppressed, so lowering of reliability and light emission efficiency of the semiconductor optical device 10 can be prevented.

Also, if the band gap energy (Eg2) of the III-V compound semiconductor layer 14 is larger than the band gap energy (Eg1) of the GaAs substrate 12, movement of carriers from the active layer 16 to the GaAs substrate 12 can be suppressed. Consequently, nonradiative recombination of carriers due to defects on the diffraction grating surface 12a can be effectively suppressed, so that a deterioration of the light emission efficiency of the semiconductor optical device 10 can be further prevented.

In addition, since, with the semiconductor optical device 10, the diffraction grating is formed prior to formation of the active layer 16, the quality of the diffraction grating can be ascertained at an early stage. Consequently, the production of optical devices which have bad qualities due to the unsatisfactory grating formation can be stopped at an early stage, so that the productivity of quality products can be enormously increased and production costs of the semiconductor optical device can be reduced.

In addition, preferably the thickness of the III-V compound semiconductor layer 14 is not more than 0.2 µm. In this case, when voltage is applied between the electrode 22 and the electrode 24, taking the electrode 22 as the high potential side, one type of carriers (in this case holes) are injected into the active layer 16 from the upper cladding layer 18. On the other hand, since the thickness of the III-V compound semiconductor layer 14 is not more than 0.2 µm, the other type of carriers (in this case electrons) are injected into the active layer 16, from the GaAs substrate 12 passing through the III-V compound semiconductor layer 14. Light is emitted from the active layer 16 by recombination of the electrons and holes in the active layer 16.

In this case, since the band gap energy (Eg1) of the GaAs substrate 12 is larger than the band gap energy (Eg3) of the active layer 16 and the refractive index of the GaAs substrate 12 is smaller than the refractive index of the active layer 16, the GaAs substrate 12 functions as a lower cladding (member that confines carriers and waveguiding light within the active layer 16). Consequently, there is no need to grow a thick lower cladding layer (a thickness of more than 2 µm is usually required in order to satisfactorily confine the waveguiding light) between the GaAs substrate 12 and the active layer 16. Consequently, the structure of the semiconductor optical device 10 can be simplified and the number of process steps can be reduced, so the production costs of the semiconductor optical device can decrease. Likewise also since the growth of a lower cladding layer is unnecessary, the operation time of the crystal growth equipment can be significantly reduced, which contributes to suppressing degradation of the crystal growth equipment.

Also, if the thickness of the III-V compound semiconductor layer 14 is not more than 0.2 µm, the III-V compound semiconductor layer 14 can be grown in a short time. Consequently, even though a III-V compound semiconductor layer 14 is introduced, productivity is not impaired.

Figure 2:
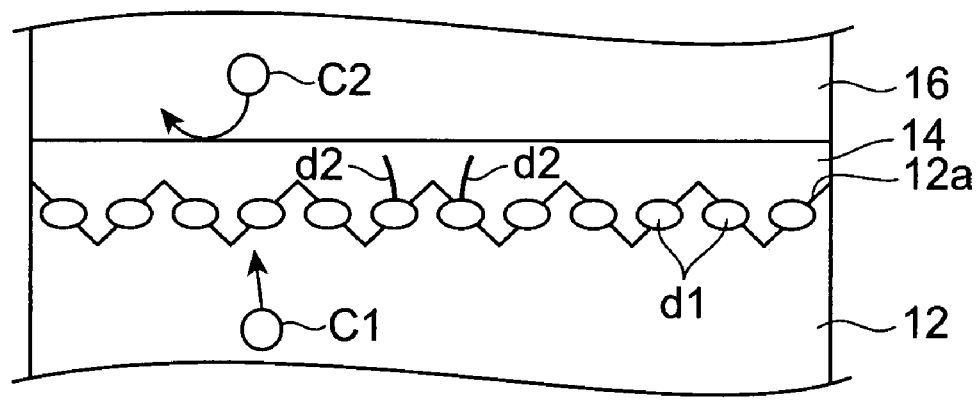
FIG. 2 is a view showing schematically part of the semiconductor optical device shown in FIG. 1.

FIG. 2 is a view showing schematically a part of the semiconductor optical device shown in FIG. 1. As shown in FIG. 2, when crystal defects d1 present on the diffraction grating surface 12a of the GaAs substrate 12 propagate, crystal defects d2 are formed in the III-V compound semiconductor layer 14. However, the crystal defects d2 are terminated in the III-V compound semiconductor layer 14 by the provision of the III-V compound semiconductor layer 14. If the III-V compound semiconductor layer 14 is a crystal layer of high quality, the crystal defects d2 are easily terminated in the III-V compound semiconductor layer 14. Consequently, since the crystal defects d2 cannot easily reach the active layer 16, crystal deterioration of the active layer 16 can be suppressed. Consequently, a semiconductor optical device 10 having high reliability is obtained.

In addition, if the band gap energy (Eg2) of the III-V compound semiconductor layer 14 is larger than the band gap energy (Eg1) of the GaAs substrate 12, the band gap energy difference between the III-V compound semiconductor layer 14 and active layer 16 becomes very large. Consequently, leakage of carriers C2 from the active layer 16 through the III-V compound semiconductor layer 14 into the GaAs substrate 12 can be suppressed. As a result, more carriers can be confined in the active layer 16. Consequently, a semiconductor optical device 10 of high light emission efficiency is obtained.

Also, carriers (in this case electrons) C1 propagate towards the diffraction grating surface 12a of the GaAs substrate 12. However, the carriers (in this case holes) C2 that propagate towards the III-V compound semiconductor layer 14 from the active layer 16 are blocked by a hetero barrier at the interface between the active layer 16 and the III-V compound semiconductor layer 14. Consequently, it is difficult for the carriers C2 to reach the surface 12a of the GaAs substrate 12, so that nonradiative recombination of holes and electrons at crystal defects d1 present on the surface 12a of the GaAs substrate 12 is greatly reduced. As a result, the deterioration of internal quantum efficiency can be suppressed, so the light emission efficiency is very greatly improved.

Also, if the band gap energy (Eg2) of the III-V compound semiconductor layer 14 is larger than the band gap energy (Eg1) of the GaAs substrate 12, the refractive index of the III-V compound semiconductor layer 14 becomes significantly lower than the refractive index of the GaAs substrate 12. Consequently, since the refractive index difference between the active layer 16 and the region outside this layer is larger than in the case where there is no III-V compound semiconductor layer 14, more light can be confined in the active layer 16. Consequently, the light emission efficiency of the semiconductor optical device 10 is raised.

As described above, since, with the semiconductor optical device 10, the ability to confine carriers and light can be improved, for example the light emission performance and its dependence on temperature of the semiconductor optical device 10 can be improved.

Also, if the III-V compound semiconductor layer 14 is made of undoped III-V compound semiconductor, the absorption of waveguiding light by free carriers in the III-V compound semiconductor layer 14 is suppressed, so absorption losses of waveguiding light become low. Consequently, the light emission efficiency of the semiconductor optical device 10 can be further improved.

A further III-V compound semiconductor layer may be provided between the active layer 16 and the upper cladding layer 18. This further III-V compound semiconductor layer is preferably made of the same structure and material as the III-V compound semiconductor layer 14. This further III-V compound semiconductor layer may be made of undoped III-V compound semiconductor, or may be of second conductivity type. If the upper cladding layer 18 is made of GaAs, the band gap energy of this further III-V compound semiconductor layer is preferably larger than the band gap energy of GaAs. In this case, more carriers can be confined in the active layer 16 than if this semiconductor layer is absent. Also in this case, this further III-V compound semiconductor layer has a lower refractive index than GaAs, so the refractive index difference between the active layer and the region outside this layer can be made larger than in the case where there is no such semiconductor layer, and, as a result, more light can be confined in the active layer 16. For these reasons, the light emission performance of the semiconductor optical device 10 is improved.

It should be noted that, in a semiconductor optical device using an InP substrate instead of the GaAs substrate, it is difficult to grow a III-V compound semiconductor layer having a band gap energy that is larger than the band gap energy of the InP substrate on the InP substrate. The reason for this is that no materials exist which are lattice-matched to InP substrate and have a higher band gap than InP.

Figure 3:
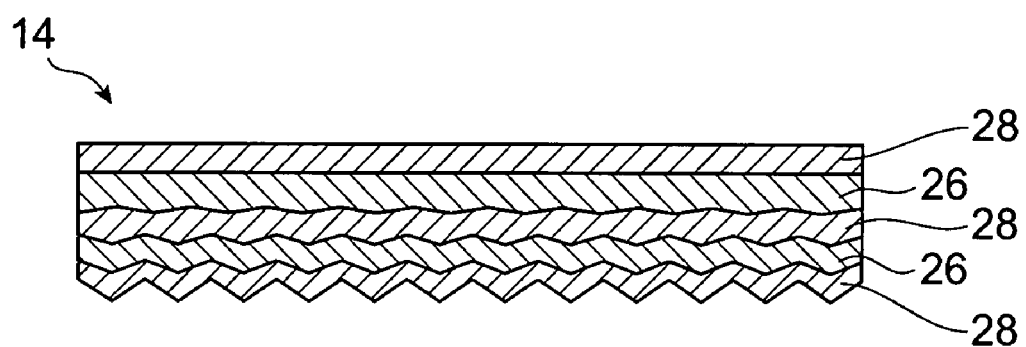
FIG. 3 is a cross-sectional view showing an example of the structure of a III-V compound semiconductor layer.

FIG. 3 is a cross-sectional view showing an example of the structure of a III-V compound semiconductor layer 14. As shown in FIG. 3, the III-V compound semiconductor layer 14 may include first semiconductor layers 26 and second semiconductor layers 28 that are alternately stacked. The III-V compound semiconductor layer 14 thus has a multi-layered structure. In particular, preferably the III-V compound semiconductor layer 14 has a superlattice structure wherein the semiconductor layers 26 and semiconductor layers 28 are formed by thin films of thickness a few nm in each case. In this case, the equivalent band gap energy (Eg2) of the III-V compound semiconductor layer 14 is substantially the same as the band gap energy corresponding to a material of composition represented by a weighted average of the composition of the material of the semiconductor layer 26 and the composition of the material of the semiconductor layer 28. Namely, with the semiconductor layer 26, we multiply the composition by the ratio of the total thickness of this layer to the entire thickness of the super lattice semiconductor layer 14, and thus obtain the product. With the semiconductor layer 28, we calculate the same product, summing up these two products, the weighted average composition is obtained. For example, if the superlattice layers 26 are of composition: $Al_{x1}Ga_{1-x1}As$, thickness d1, number of layers N1, and the semiconductor layers 28 are of composition: $Al_{x2}Ga_{1-x2}As$, thickness d2, number of layers N2, the equivalent band gap energy of these superlattice layers is equal to the band gap energy of AlGaAs with an average composition calculated as follows:

Al average composition=$(x1*d1*N1+x2*d2*N2)/(d1*N1+d2*N2)$

Ga average composition=$\{(1-x1)*d1*N1+(1-x2)*d2*N2\}/(d1*N1+d2*N2)$

As average composition=$(1*d1*N1+1*d2*N2)/(d1*N1+d2*N2)=1$

The band gap energy ($E_\alpha$) of the semiconductor layers 26 is different from the band gap energy ($E_\beta$) of the semiconductor layers 28. In this case, propagation of crystal defects is easily stopped at the interfaces between the semiconductor layers 26 and semiconductor layers 28. Therefore, it is further difficult for the defects d1 present at the surface 12a of the diffraction grating of the GaAs substrate 12 to propagate and reach the active layer 16.

The semiconductor layers 26 and semiconductor layers 28 may be of the same type of material. In this case, the composition ratio of the material of semiconductor layers 26 is different from the composition ratio of the material of the semiconductor layers 28. Examples of such materials include AlGaInP, AlGaAs, and GaInAsP. Also, the semiconductor layers 26 and semiconductor layers 28 may be made of different materials. Examples of such material combinations include AlGaInP/GaInP, AlGaInP/GaInAsP, GaInP/GaInAsP, AlGaInP/GaAs, GaInP/GaAs, AlGaAs/GaAs, and GaInAsP/GaAs. In such superlattice combinations, the equivalent band gap energy can be made larger than the bandgap energy of the GaAs substrate by suitable selection of the material composition of the semiconductor layers 26, 28. Consequently, even when such superlattices are employed for the III-V compound semiconductor layer 14, a semiconductor optical device 10 of improved light emission efficiency and reliability like that described above can be obtained.

Second Embodiment

Figure 4:
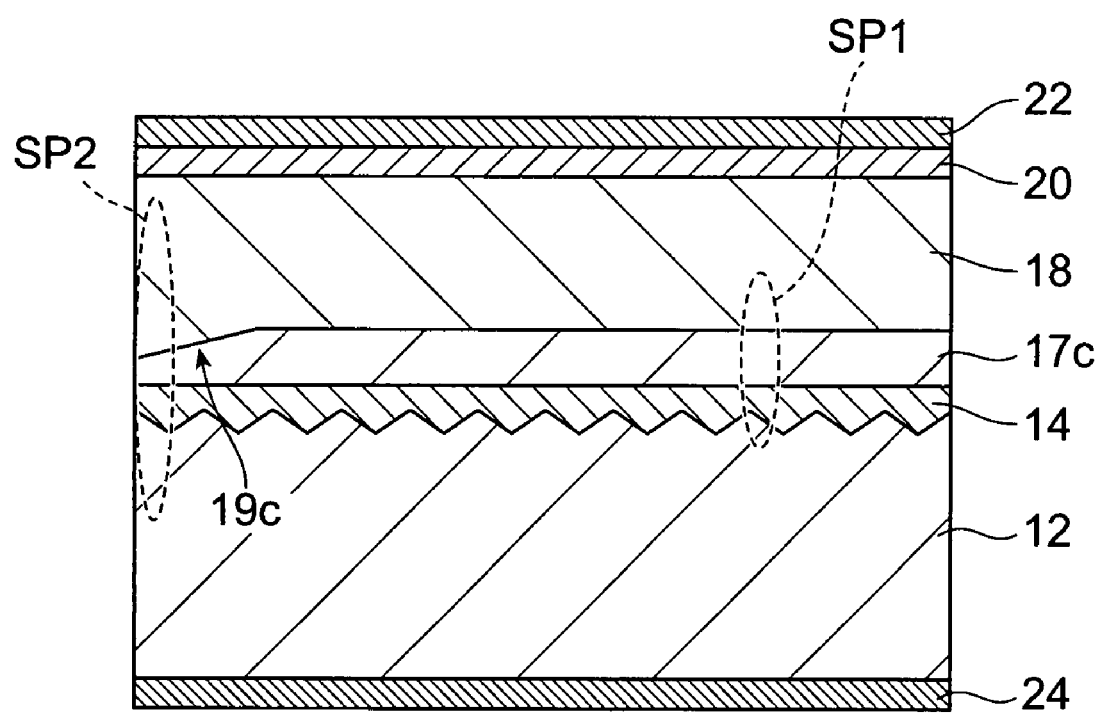
FIG. 4 is a cross-sectional view showing schematically a semiconductor optical device according to a second embodiment.

FIG. 4 is a cross-sectional view showing schematically a semiconductor optical device according to a second embodiment. In the semiconductor optical device 10a shown in FIG. 4, the active layer 16 in the semiconductor optical device 10 according to the first embodiment is replaced by an active layer 17c.

The active layer 17c is made of the same material as the active layer 16. A spot size conversion region that converts the spot size of the light is provided at the end 19c of the active layer 17c. The spot size conversion region that is formed at the end 19c has a shape wherein the thickness of the active layer 17c decreases with approaching to the output facet, and as a result, the spot size SP1 in the spot size conversion region can be expanded compared with the spot size SP2 in portions other than the spot size conversion region of the active layer 17c.

In the case described above, the thickness of the end 19c of the active layer 17c varies in the longitudinal direction (X direction), so the end 19c is not flat. Usually, the diffraction grating would be formed on the active layer, but, if the active layer is not flat, it is difficult to perform patterning or etching of the diffraction grating formed thereon with high precision and good reproducibility. Consequently, it is difficult to guarantee yield and reproducibility in manufacture of the diffraction grating. However, since, in the case of the semiconductor optical device 10a, the diffraction grating is provided between the GaAs substrate 12 and the active layer 17c, the diffraction grating can be formed with high accuracy and excellent reproducibility even when the active layer 17c is not flat.

Figure 5A:
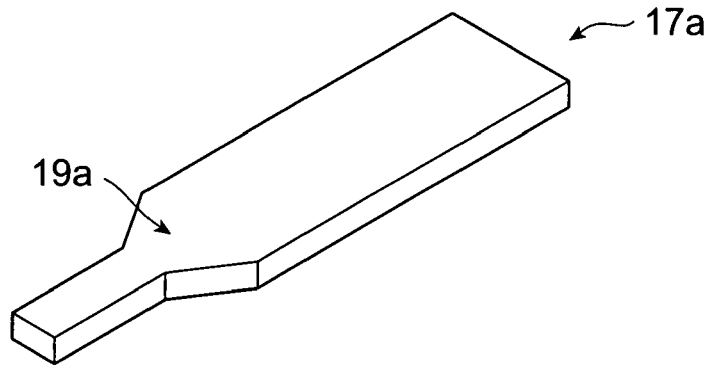
FIGS. 5A to 5D are perspective views showing schematically a specific example of the shape of the active layer.
Figure 5B:
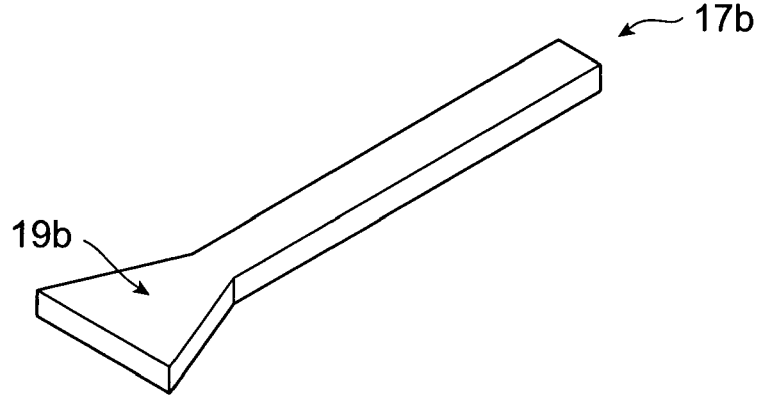
Figure 5C:
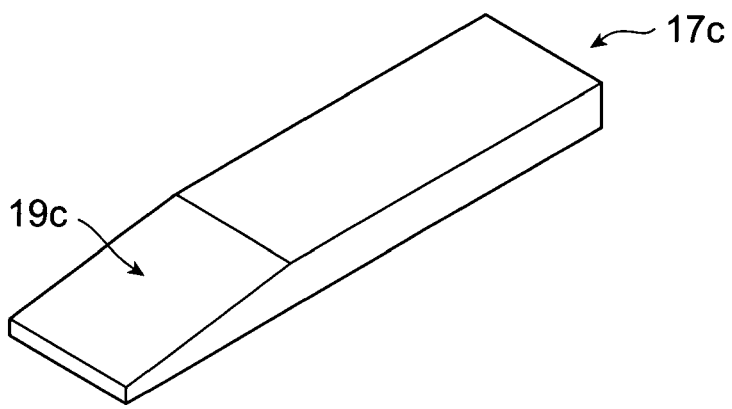
Figure 5D:
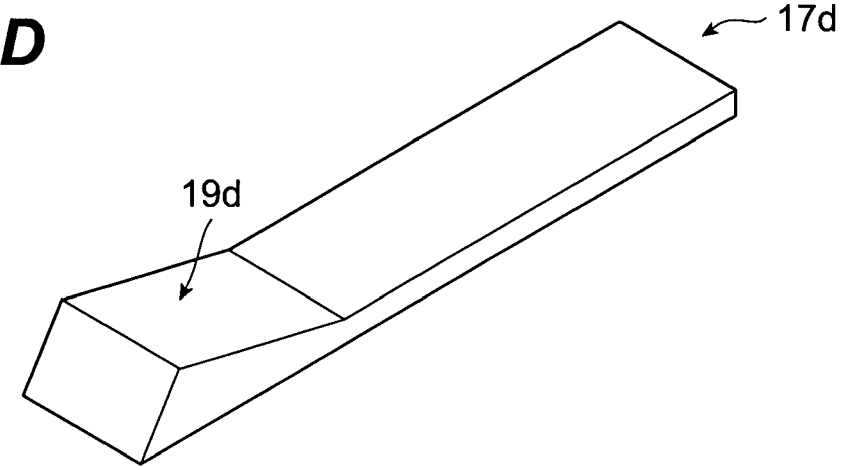

Other possibilities exist regarding the shape of the active layer with an added spot size conversion region and FIG. 5A to 5D are perspective views showing schematically specific examples of these. The end 19a of the active layer 17a shown in FIG. 5A has a shape wherein the width of the active layer 17a becomes narrower with approaching to the output facet. The end 19b of the active layer 17b shown in FIG. 5B has a shape wherein the width of the active layer 17b becomes wider with approaching to the output facet. The active layer 17c shown in FIG. 5C is the same as that shown in FIG. 4. The end 19d of the active layer 17d shown in FIG. 5D has a shape wherein the thickness of the active layer 17d increases with approaching to the output facet. In all cases, the spot size at the ends 19a to 19d can be expanded.

In an ordinary semiconductor light-emitting device in which no spot size conversion region is provided, the spot size SP1 of the light is of diameter of the order 1 to 2 μm. This is much smaller than the spot size (diameter 8 to 10 μm) of a glass optical component such as for example an optical fiber. In contrast, in the case of the end 19c of the active layer 17c, the spot size SP2 of the light can be expanded to a diameter of the order 8 to 10 μm. Consequently, in the semiconductor optical device 10a wherein this spot size conversion region is provided, when the end 19c of the active layer 17c is optically coupled with an optical fiber, the coupling efficiency can be improved.

Since the diameter of the spot size SP2 in the case of this spot size conversion region is expanded to for example 8 to 10 μm, there is considerable leakage of light from the active layer 16 towards the cladding layer. In this case, in order to prevent increase in waveguiding losses due to leakage of this expanded light to outside the cladding layer, it is necessary to increase the thickness of the upper and lower cladding layers to an extent such as to contain the light sufficiently in these layers: for example in the case of a spot size of 8 to 10 μm, the thickness of the upper and lower cladding layers must be increased compared with the prior art structure to an extent of about half thereof i.e. 4 to 5 μm. However, using actual crystal growth equipment, an enormous time is required to grow cladding layers of such thickness, resulting in poor productivity and accelerated deterioration of the crystal growth equipment due to overuse of it. On the other hand, in the semiconductor optical device 10a, the GaAs substrate 12 can also function as the thick lower cladding layer, so that another lower cladding layer becomes unnecessary. Consequently, compared with the prior art structure, the deterioration of productivity and degradation of the crystal growth equipment are alleviated.

Third Embodiment

Figure 6:
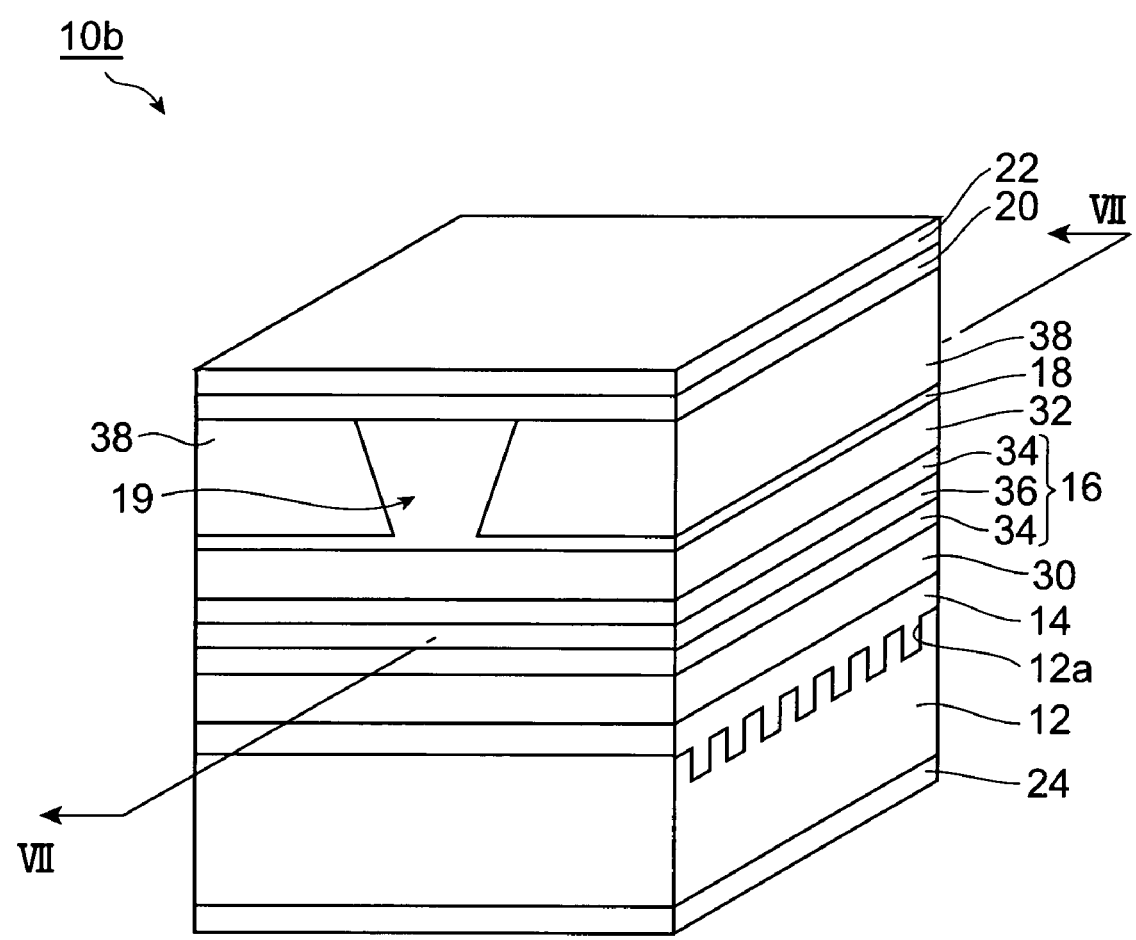
FIG. 6 is a perspective view showing schematically a semiconductor optical device according to a third embodiment.
Figure 7:
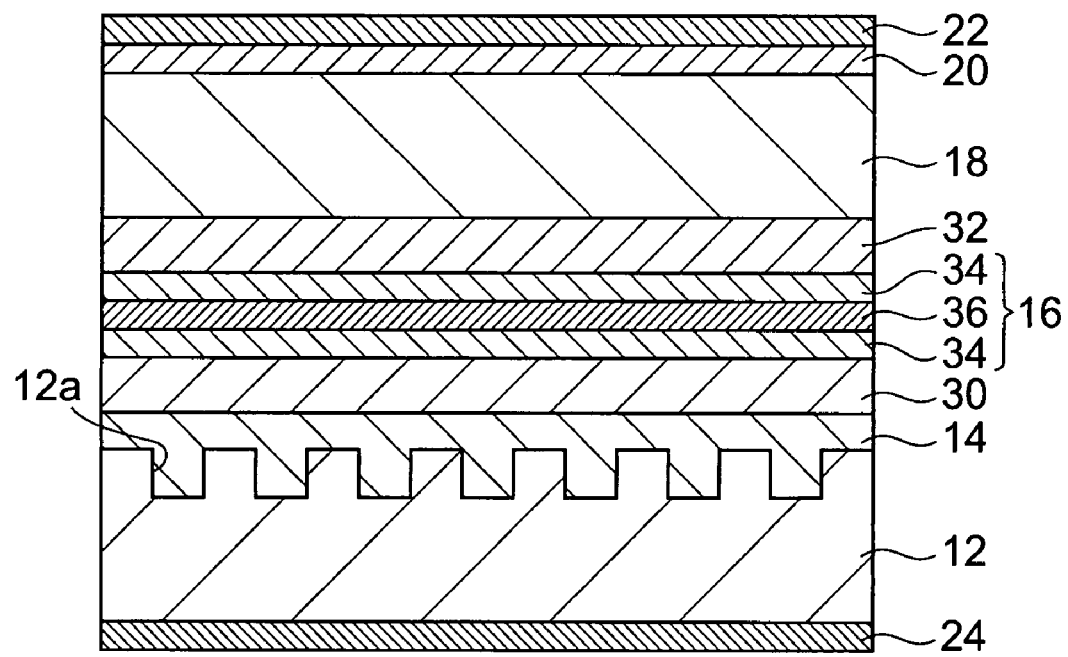
FIG. 7 is a cross-sectional view along the line VII-VII shown in FIG. 6.

FIG. 6 is a perspective view showing schematically a semiconductor optical device according to a third embodiment. FIG. 7 is a cross-sectional view along the line VII-VII shown in FIG. 6. In the semiconductor optical device 10b shown in FIG. 6 and FIG. 7, the upper cladding layer 18 in the structure of the optical semiconductor device 10 according to the first embodiment has a ridge section 19, also the semiconductor optical device 10b further comprises a current blocking region 38 of a first conductivity type (in this case n type), provided between the upper cladding 18 and contact layer 20 such as to bury this ridge section 19. A current confinement structure is formed by this ridge section 19 and the current blocking region 38. Also the active layer 16 has a quantum well structure comprising well layers 34 and barrier layers 36 alternately stacked.

Furthermore, in addition to the structure of the semiconductor optical device 10 according to the first embodiment, in the case of the semiconductor optical device 10b, an optical confinement layer 30 is provided between the active layer 16 and the III-V compound semiconductor layer 14, and an optical confinement layer 32 is provided between the active layer 16 and the upper cladding layer 18. These optical confinement layers 30, 32 are preferably undoped III-V compound semiconductors. The optical confinement layer 30 may be of first conductivity type (in this case n type). The optical confinement layer 32 may be of second conductivity type (in this case p type).

The current blocking region 38 is preferably made of semiconductor material lattice-matched to GaAs. Also, in order to confine light in the ridge section 19, the refractive index of the current blocking region 38 is preferably smaller than the refractive index of the upper cladding layer 18. If for example the upper cladding 18 is made of GaAs, examples that may be cited of semiconductor materials for constituting the current blocking region 38, which are of lower refractive index than GaAs and that can achieve lattice matching therewith, include AlGaAs, AlGaInP and GaInP. For example Se or Si are preferably employed as the n-type dopant of the current blocking region 38.

In the case of the semiconductor optical device lob, the same beneficial effect as in the case of the semiconductor optical device 10 according to the first embodiment is obtained. Furthermore, more light can be confined in the active layer 16, thanks to the optical confinement layers 30, 32. Consequently, the light emission efficiency can be further improved compared with that of the semiconductor optical device 10 according to the first embodiment.

Preferably the band gap energy of the optical confinement layer 30 is between the band gap energy (Eg1) of the GaAs substrate 12 and the band gap energy (Eg3) of the well layer 34. If this is the case, the optical confinement layer 30 does not constitute a barrier when carriers are injected into the well layer 34 from the GaAs substrate 12. Likewise, preferably the band gap energy of the optical confinement layer 32 is between the band gap energy (Eg4) of the upper cladding layer 18 and the band gap energy (Eg3) of the well layer 34. If this is the case, the optical confinement layer 32 does not constitute a barrier when carriers are injected into the well layer 34 from the upper cladding layer 18.

Also, the refractive index of the optical confinement layer 30 is preferably between the refractive index of the GaAs substrate 12 and the refractive index of the well layer 34, while the refractive index of the optical confinement 32 is preferably between the refractive index of the upper cladding layer 18 and the refractive index of the well layer 34. In this case, the GaAs substrate 12 and upper cladding layer 18 act so as to confine light generated in the well layer 34 within the active layer 16 and optical confinement layers 30, 32; as a result, confinement of light into the active layer 16 is more enhanced. In particular, when the active layer 16 has a quantum well structure, only a small optical confinement factor can be achieved by only active layer 16 itself, but it can be greatly increased by introducing the optical confinement layers 30, 32.

As an example of material that may be used for the optical confinement layers 30, 32, there may be mentioned the III-V compound semiconductor material containing N, Ga and As mentioned in the first embodiment. Apart from this, the optical confinement layers 30, 32 may be made of for example GaInAs or GaInAsP. These have a lattice constant that is the same as or close to the lattice constant of GaAs. Consequently, optical confinement layers 30, 32 of excellent crystal properties can be epitaxially grown on the GaAs substrate 12, since defects caused by lattice mismatching are not produced. The band gap energy and the refractive indices of the optical confinement layers 30, 32 can be adjusted to the desired values by adjusting the composition ratios of the materials. Also, as the material of the barrier layer 36, the same material as the material of the optical confinement layers 30, 32 may be employed.

Figure 8A:
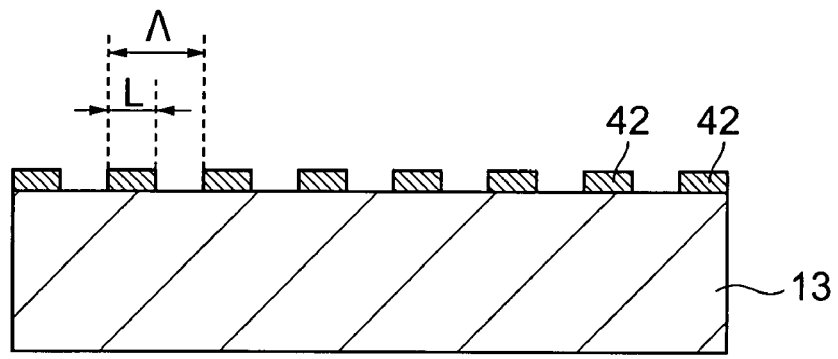
FIGS. 8A to 8C are cross-sectional views showing schematically steps in a method of manufacturing a semiconductor optical device according to a third embodiment.
Figure 8B:
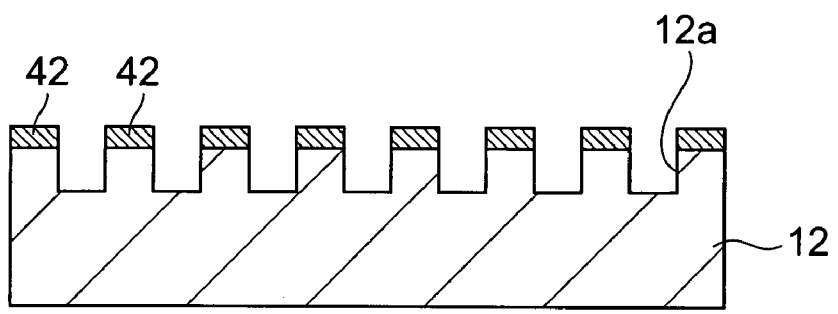
Figure 8C:
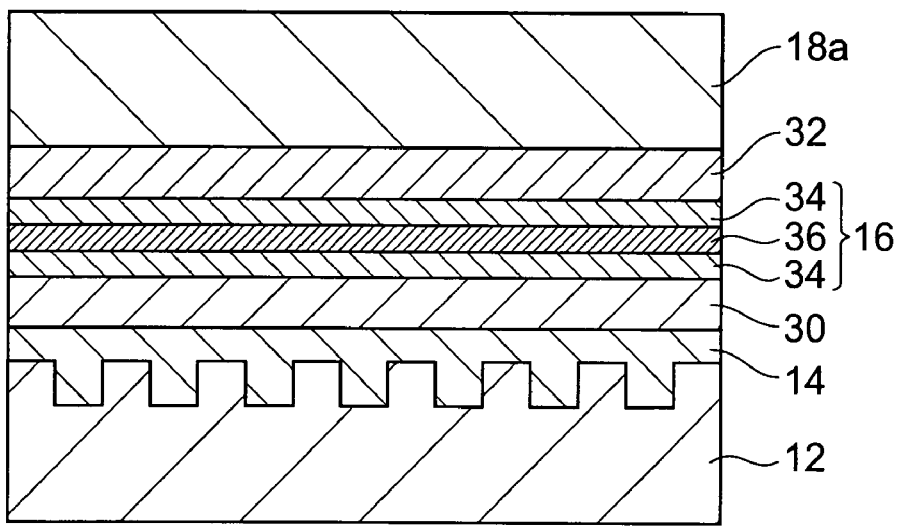
Figure 9A:
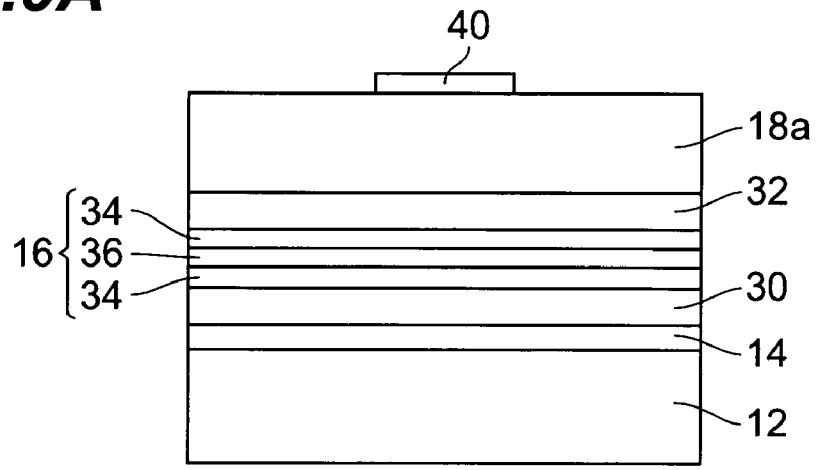
FIGS. 9A to 9C are views showing schematically steps of a method of manufacturing a semiconductor optical device according to the third embodiment.
Figure 9B:
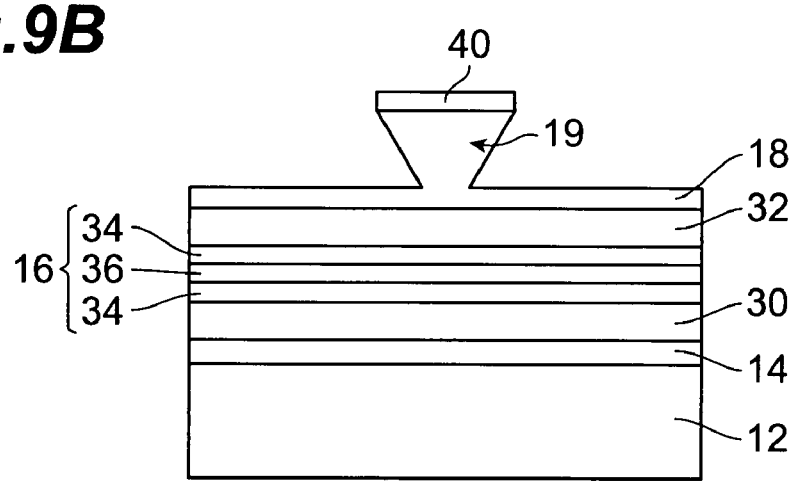
Figure 9C:
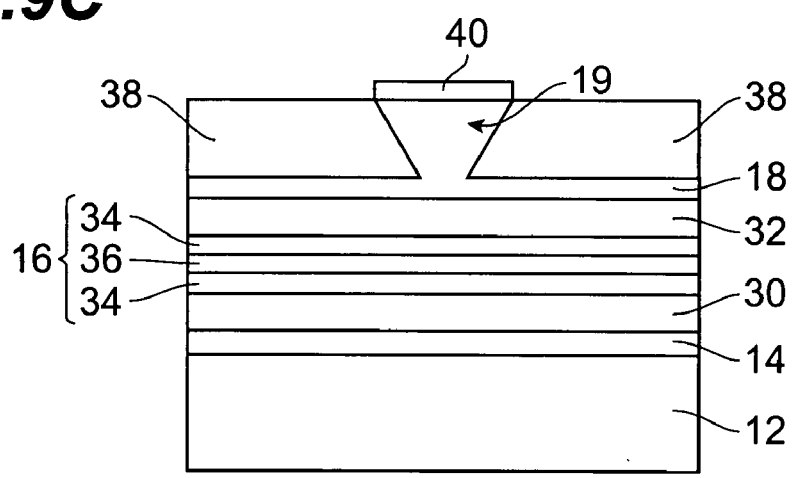

FIGS. 8A to 8C are cross-sectional views showing schematically steps in a method of manufacturing a semiconductor optical device according to the third embodiment. FIGS. 9A to 9C are views showing schematically steps in a method of manufacturing a semiconductor optical device according to the third embodiment. A method of manufacturing a semiconductor optical device 10b is described below.

First of all, as shown in FIG. 8A, resist masks 42 arranged periodically with prescribed pitch Λ are formed on a GaAs substrate 13. Preferably the resist mask 42 has a stripe-configuration. Preferably, the width. L of the resist mask 42 is suitably adjusted so that the coupling coefficient of the diffraction grating is optimum for the operation of the semiconductor light-emitting device 10b. For example a holographic exposure method or EB exposure method may be employed when forming the resist mask 42.

Next, as shown in FIG. 8B, wet etching or dry etching of the GaAs substrate 13 is performed using the resist mask 42. In this way, a GaAs substrate 12 having a surface 12a formed with projections and recesses for a diffraction grating is obtained.

Next, as shown in FIG. 8C, a III-V compound semiconductor layer 14, an optical confinement layer 30, a well layer 34, a barrier layer 36, a well layer 34, an optical confinement layer 32 and an upper cladding layer 18a are formed in that order on a surface 12a of a GaAs substrate 12. These layers may be formed using for example the MBE method, OMVPE method or LPE method of crystal growth. If for example the OMVPE method is used, metal organic compound such as for example TEG, TMG, TMI or TMA may suitably be used as the group III source material. As the group V source material, hydride gases such as for example $AsH_3$ or $PH_3$ may suitably be employed. As the N source material, for example DMHy may suitably be employed. As the p type dopant, for example Zn may be employed.

Next, as shown in FIG. 9A, a dielectric mask 40 that is patterned so as to correspond to the shape of the top face of the ridge section 19 is formed on the upper cladding layer 18a. The dielectric mask 40 is made of for example SiN or $SiO_2$.

Next, as shown in FIG. 9B, an upper cladding layer 18 having a ridge section 19 is formed by dry etching or wet etching of the upper cladding layer 18a using the dielectric mask 40.

Next, as shown in FIG. 9C, a current blocking region 38 is grown on the upper cladding layer 18 so as to bury the ridge section 19.

Next, after removal of the dielectric mask 40, as shown in FIG. 6 and FIG. 7, a contact layer 20 is grown on the ridge section 19 and current blocking region 38. After this, an electrode 22 is formed on the contact layer 20 using for example an evaporation method or sputtering method, and an electrode 24 is formed on the back face of the GaAs substrate 12. In this way, a semiconductor optical device 10b is manufactured.

It should be noted that, as the material of the current blocking region 38, there may be employed for example benzocyclobutene (BCB), polyimide, or a semi-insulating semiconductor. Also, instead of the current blocking region 38, the side faces of the ridge section 19 may be covered with an insulating film of for example SiN or $SiO_2$. Furthermore, when etching the upper cladding layer 18a, a mesa section may be formed by etching as far as the active layer 16 and a buried hetero structure may then be produced wherein this mesa section is buried by a semiconductor region having a heterojunction.

Although suitable embodiments of the present invention have been described above in detail, the present invention is not restricted to the above embodiments.

For example, the semiconductor optical devices 10, 10a, 10b are not restricted to semiconductor lasers, but could be for example LEDs, semiconductor optical amplifier devices, electro-absorption type optical modulators or semiconductor optical integrated devices obtained by integrating these. In all these cases, the bad effects that crystal defects present at the surface of the diffraction grating have on the active layer can be reduced.

According to the present invention, a semiconductor optical device is provided that is of high reliability and high light emission efficiency.

What is claimed is:

1. A semiconductor optical device comprising:
   a GaAs substrate having a grating surface with a diffraction grating obtained by periodic projections and recesses extending over the entire grating surface of the substrate;
   a III-V compound semiconductor layer provided on the grating surface of the GaAs substrate, the III-V compound semiconductor layer having a thickness that is more than a groove depth of the periodic projections so as to bury both the projections and the recesses, and having an opposite surface that is flat; and
   an active layer made of a III-V compound semiconductor containing nitrogen and arsenic as constituent elements, the active layer being provided on the III-V compound semiconductor layer, wherein
   the III-V compound semiconductor layer has a band gap energy that is larger than either the GaAs substrate or the active layer, and
   a total thickness of the III-V compound semiconductor layer is more than 5 nm and less than or equal to 50 nm.

2. The semiconductor optical device according to claim 1, wherein the III-V compound semiconductor layer has a flat top surface and contains a first semiconductor layer and a second semiconductor layer alternately stacked, and
   wherein the band gap energy of the first semiconductor layer is different from the band gap energy of the second semiconductor layer.

3. The semiconductor optical device according to claim 1, wherein a spot size conversion region is provided at the end of the active layer.

4. The semiconductor optical device according to claim 2, wherein the III-V compound semiconductor layer has a superlattice structure.

5. The semiconductor optical device according to claim 1, wherein the III-V compound semiconductor layer is made of Al-free material.

6. The semiconductor optical device according to claim 1, wherein the surface of the GaAs substrate has a crystal defect and the periodic projections and recesses are formed thereon.

7. The semiconductor optical device according to claim 1, wherein
   the III-V compound semiconductor layer is made of GaInP, GaInAsP, AlGaAs, or AlGaInP, and
   the III-V compound semiconductor layer is lattice-matched to GaAs.

8. The semiconductor optical device according to claim 1, wherein the III-V compound semiconductor layer is made of an undoped III-V compound semiconductor.

9. The semiconductor optical device according to claim 1, wherein
   the GaAs substrate is made of a first conductive type GaAs, and
   the III-V compound semiconductor layer is made of a first conductive type III-V compound semiconductor.

* * * * *